(12) United States Patent
Mikalo et al.

(10) Patent No.: US 7,144,776 B1
(45) Date of Patent: Dec. 5, 2006

(54) CHARGE-TRAPPING MEMORY DEVICE

(75) Inventors: Ricardo Pablo Mikalo, Waltersdorf (DE); Erwin Schroer, Catania (IT); Günther Wein, Nittendorf (DE); Jens-Uwe Sachse, Dresden (DE); Mark Isler, Dresden (DE); Jan-Malte Schley, München (DE); Christoph Andreas Kleint, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/141,254

(22) Filed: May 31, 2005

(51) Int. Cl.
*H01L 21/336* (2006.01)
(52) U.S. Cl. ...................... 438/261; 438/287
(58) Field of Classification Search ............... 438/216, 438/261, 262, 287, 303, 770
See application file for complete search history.

(56) References Cited

U.S. PATENT DOCUMENTS

| | | | |
|---|---|---|---|
| 5,768,192 A | 6/1998 | Eitan | |
| 5,830,794 A | 11/1998 | Kusunoki et al. | |
| 5,966,603 A * | 10/1999 | Eitan | 438/258 |
| 6,011,725 A | 1/2000 | Eitan | |
| 6,426,247 B1 * | 7/2002 | Divakaruni et al. | 438/185 |
| 6,869,843 B1 * | 3/2005 | Hsu et al. | 438/262 |
| 6,913,987 B1 * | 7/2005 | Haufe et al. | 438/586 |
| 7,041,545 B1 * | 5/2006 | Willer | 438/200 |
| 2003/0205727 A1 | 11/2003 | Shin et al. | |

OTHER PUBLICATIONS

Eitan, B, et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—T. N. Quach
(74) *Attorney, Agent, or Firm*—Slater & Matsil, L.L.P.

(57) ABSTRACT

An oxidized region is arranged between a substrate of semiconductor material and a nitride liner, which covers wordline stacks of a memory cell array and intermediate areas of the substrate, and is provided to separate the nitride liner both from the substrate and from a memory layer sequence of dielectric materials that is provided for charge-trapping. The nitride liner is used as an etching stop layer in the formation of sidewall spacers used in a peripheral area to produce source/drain junctions of transistors of the addressing circuitry.

10 Claims, 3 Drawing Sheets

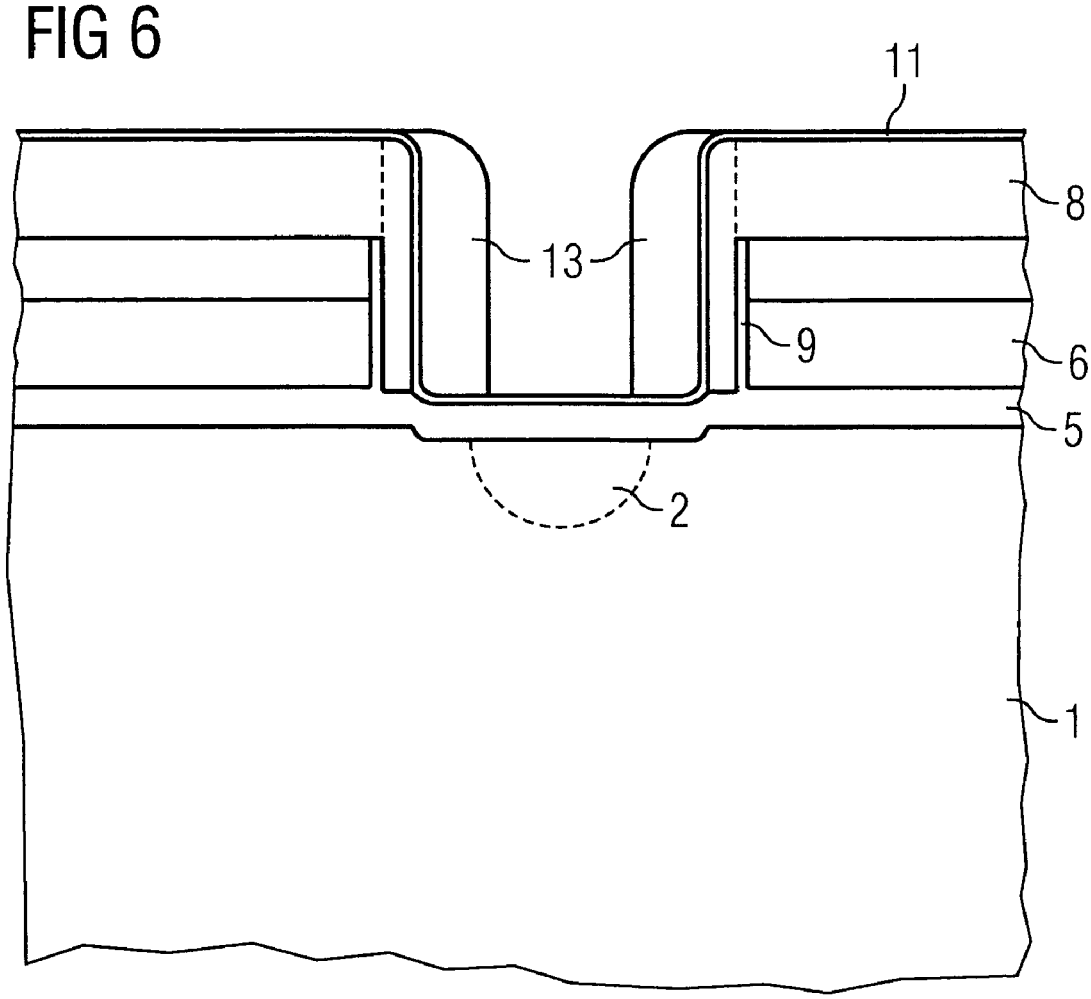

CHARGE-TRAPPING MEMORY DEVICE

TECHNICAL FIELD

This invention concerns memory devices comprising arrays of charge-trapping memory cells.

BACKGROUND

Nonvolatile memory cells that are electrically programmable and erasable can be realized as charge-trapping memory cells, which comprise a memory layer sequence of dielectric materials with a memory layer between confinement layers of dielectric material having a larger energy band gap than the memory layer. The memory layer sequence is arranged between a channel region within a semiconductor body and a gate electrode provided to control the channel by means of an applied electric voltage. Examples of charge-trapping memory cells are the SONOS memory cells, in which each confinement layer is an oxide and the memory layer is a nitride of the semiconductor material, usually silicon (U.S. Pat. Nos. 5,768,192, and 6,011,725, which are incorporated herein by reference).

Charge carriers are accelerated from source to drain through the channel region and gain enough energy to be able to penetrate the lower confinement layer and to be trapped within the memory layer. The trapped charge carriers change the threshold voltage of the cell transistor structure. Different programming states can be read by applying the appropriate reading voltages.

A publication by B. Eitan et al., "NROM: a Novel Localized Trapping, 2-Bit Nonvolatile Memory Cell" in IEEE Electron Device Letters, volume 21, pages 543 to 545 (2000), describes a charge-trapping memory cell with a memory layer sequence of oxide, nitride and oxide, which is especially adapted to be operated with a reading voltage that is reverse to the programming voltage (reverse read). The oxide-nitride-oxide layer sequence is especially designed to avoid the direct tunneling regime and to guarantee the vertical retention of the trapped charge carriers. The oxide layers are specified to have a thickness of more than 5 nm.

The memory layer can be substituted with another dielectric material, provided the energy band gap is smaller than the energy band gap of the confinement layers. The difference in the energy band gaps should be as great as possible to secure a good charge carrier confinement and thus a good data retention. When using silicon dioxide as confinement layers, the memory layer may be tantalum oxide, cadmium silicate, titanium oxide, zirconium oxide or aluminum oxide. Also intrinsically conducting (non-doped) silicon may be used as the material of the memory layer.

A semiconductor memory device comprises an array of memory cells provided for the storage of information and an addressing circuitry that is located in a peripheral area. CMOS field-effect transistors are important logic components of the addressing circuits. Source and drain regions of these field-effect transistors are arranged at a certain distance from the gate electrodes. In the production process, therefore, sidewall spacers at flanks of the gate electrode stacks are used to implant the source/drain regions so that the pn junctions between the doped regions and the basic semiconductor material are located at a distance from the gate electrode. To this end, a nitride liner is deposited on the surfaces of the substrate or semiconductor body and the gate electrode stacks. This liner protects the areas of shallow trench isolations between the devices and serves as an etching stop layer for the RIE (reactive iron etching) of the oxide spacers. After the implantations of the source/drain regions have taken place, the oxide spacers are removed, usually by means of wet chemical etching. The oxide spacers are preferably formed as TEOS (tetraethylorthosilicate) spacers, and the oxide is applied directly onto the nitride liner. The oxide can be removed selectively to the nitride of the liner. Therefore, the nitride liner is suitable as an etching stop layer in this production step.

However, a nitride liner, which is applied all over the surface of the device and thus covers also the area of the memory cell array, shows negative effects on the performance of the memory cell transistors. The nitride liner is directly adjacent to the wordline stack of the memory cells and is in contact with the memory layer sequence, which is usually oxide/nitride/oxide. This is supposed to cause poor values of retention after cycling (RAC), which is one of the key parameters to be optimized in a charge-trapping memory device. Insufficient RAC values are probably related to a high trapping density of charge carriers in the nitride liner and/or to high mechanical stress caused by the nitride liner being deposited directly on the memory layer sequence so that a formation of leakage paths in the memory layer sequence may result.

SUMMARY OF THE INVENTION

In one aspect, the present invention provides a charge-trapping memory device with improved retention after cycling values, especially an NROM cell comprising an oxide-nitride-oxide memory layer sequence.

In a further aspect, this invention removes the difficulties deriving from the application of a nitride liner adjacent to the memory layer sequence.

A solution to achieve advantages is the formation of an oxidized region underneath the nitride liner and especially the formation of lateral oxidized regions between the memory layer sequence and the nitride liner. The oxide serves to cause a stress relaxation at the location between the nitride liner and the semiconductor body or substrate and bars the loss of charge carriers out of the memory layer into the liner nitride. The oxidized region can be produced by the growth of a thermal oxide using rapid thermal oxidation (RTO) or radical-based oxidation. Both these methods can replace a standard anneal to activate the implanted dopant under nitrogen atmosphere, which provides the additional advantage that no further production step is necessary. The process option of radical-based oxidation oxidizes besides the bulk semiconductor material, preferably silicon, also the nitride of an oxide-nitride-oxide memory layer sequence and thus enables a spatial separation of the memory layer from the nitride liner. The loss of charge carriers moving into the nitride liner can thus effectively be inhibited. Other process steps, especially the formation of the TEOS spacers, are not affected unfavorably.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawing, in which:

FIG. 6 shows a cross-section of a section of the addressing periphery after the formation of the oxide spacers.

The following list of reference symbols can be used in conjunction with the figures:

| | |
|---|---|
| 1 | substrate |
| 2 | source/drain region |
| 3 | memory layer sequence |
| 31 | lower boundary layer |
| 32 | memory layer |
| 33 | upper boundary layer |
| 4 | wordline stack |
| 5 | gate dielectric |
| 6 | gate electrode |
| 7 | sidewall insulation |
| 8 | top insulation |
| 9 | oxide layer |
| 10 | oxidized region |
| 101 | lateral oxidized region |
| 11 | nitride liner |
| 12 | spacer layer |
| 13 | sidewall spacer |
| 14 | oxidized layer |

DETAILED DESCRIPTION OF ILLUSTRATIVE EMBODIMENTS

Figure 1:
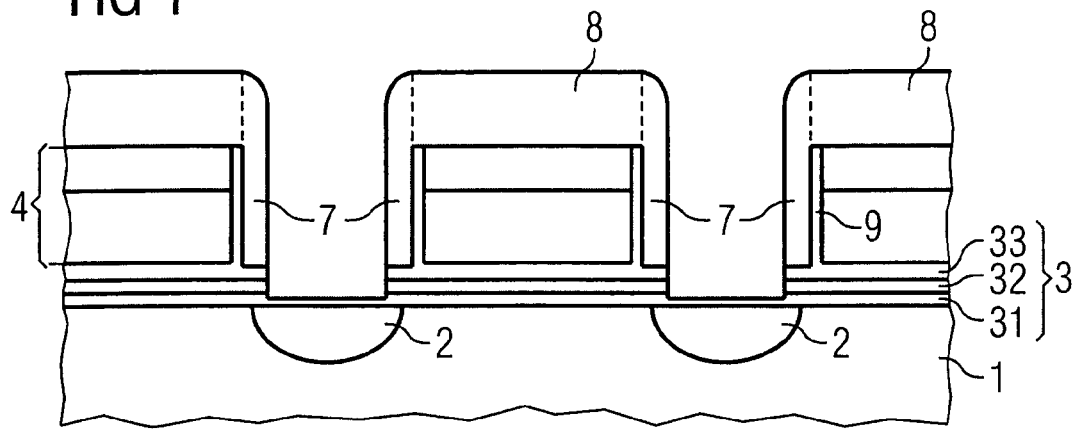
FIG. 1 shows a cross-section of a section of the memory cell array before the application of the nitride liner.

The features of an embodiment of the device according to embodiments of this invention are further described following a preferred production process. FIG. 1 shows a cross-section of the memory cell array transverse to the longitudinal direction of the wordlines. The semiconductor body, e.g., a substrate 1, source/drain regions 2, a memory layer sequence 3 comprising a lower boundary layer 31, a memory layer 32, and an upper boundary layer 33, the wordline stacks 4 including the gate electrodes of the cell transistors with sidewall insulations 7 in spacer form and top insulations 8 and an oxide layer 9 covering the sidewalls of the wordline stacks and forming a part of the upper boundary layer 33 are shown for an intermediate product of a typical preferred embodiment.

Between the spacers of the sidewall insulations 7, the memory layer sequence has been removed to leave only a thin residual layer of the lower boundary layer 31. Instead, the whole memory layer sequence 3 can be left also in the areas above the source/drain regions 2. The wordline stacks 4 are shown as double-layer strips extending perpendicularly to the drawing plane and typically comprising a lower layer of preferably polysilicon, encompassing the gate electrodes of the transistor structures of the memory cells, and an upper electrically conductive wordline layer, which is provided to reduce the track resistance. The upper portion can be a silicide such as tungsten silicide, cobalt silicide or nickel silicide, as examples.

The structure shown in the cross-section of FIG. 1 is the intermediate product of the manufacturing process on which the nitride liner is to be applied. In order to produce the structure of the inventive device, the surface of the semiconductor body or substrate 1 in the areas above the source/drain regions 2 is oxidized to form the oxidized regions 10, which are shown in FIG. 2.

Figure 2:
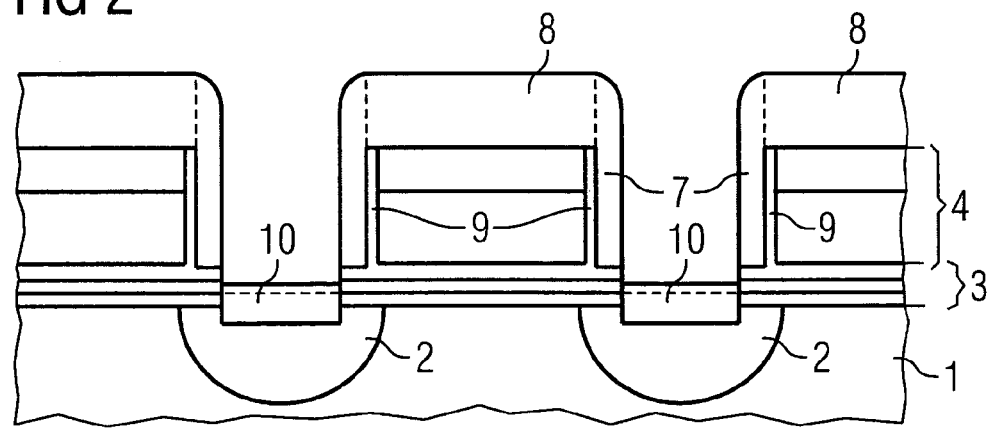
FIG. 2 shows the cross-section according to FIG. 1 after the formation of the oxidized regions.

FIG. 2 shows the cross-section according to FIG. 1 after the formation of the oxidized regions 10 and an annealing step to activate the implanted dopant, which results in an extension of the dimensions of the source/drain regions 2. The remaining partial layer of the lower boundary layer 31, which may be an oxide, is indicated by the broken line in the oxidized region 10. This remaining partial lower boundary layer 31 is lifted when the semiconductor material of the semiconductor body or substrate 1 is oxidized and the volume of the oxidized material is considerably increased.

Figure 3:
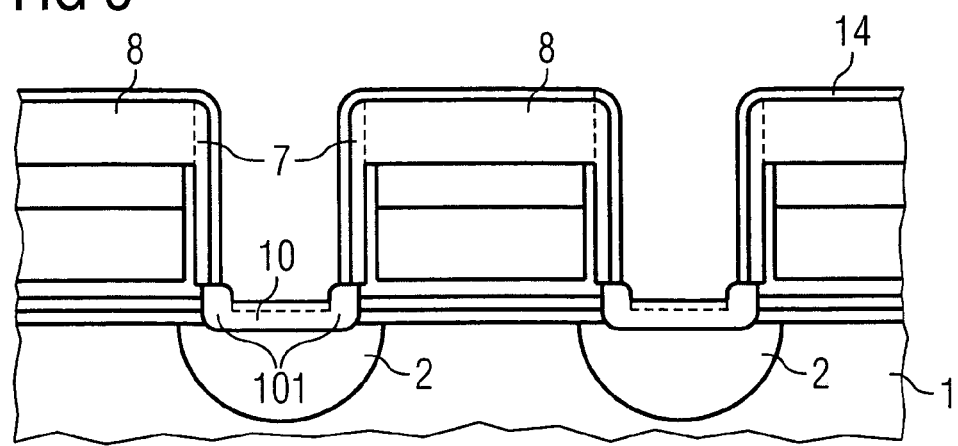
FIG. 3 shows the cross-section according to FIG. 2 of another embodiment.

FIG. 3 shows the cross-section according to FIG. 2 for another embodiment, which comprises lateral oxidized regions 101 located between the memory layer sequence and the nitride liner. These lateral oxidized regions 101 can preferably be produced by means of a radical-based oxidation process instead of an annealing procedure under nitrogen atmosphere. The sidewall insulations 7 and the top insulations 8 can preferably be nitride. In this case, the radical-based oxidation produces thin oxidized layers 14 that cover the surfaces of the nitride material, as shown in FIG. 3.

Figure 4:
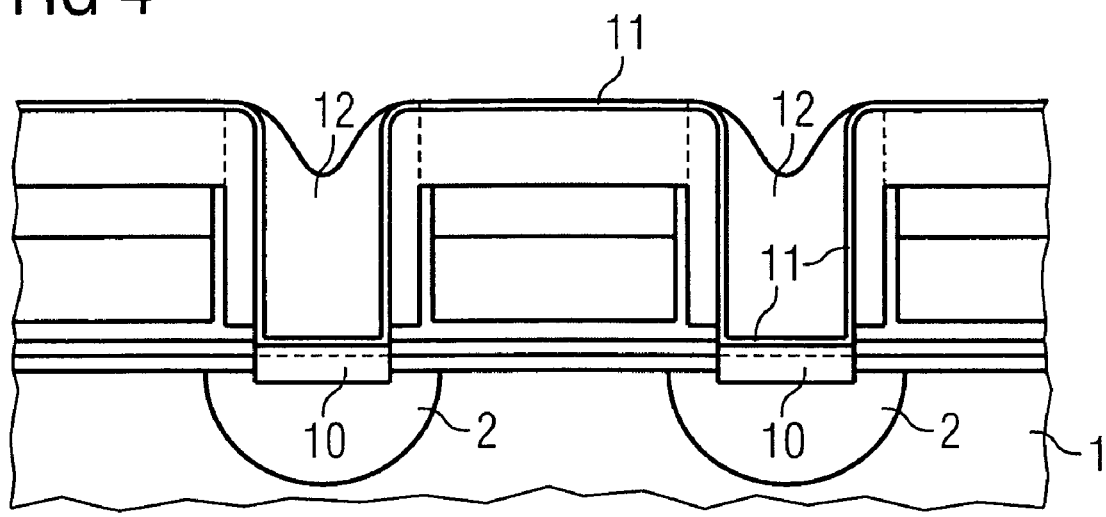
FIG. 4 shows the cross-section according to FIG. 2 after the application of the nitride liner and the spacer layer.
Figure 5:
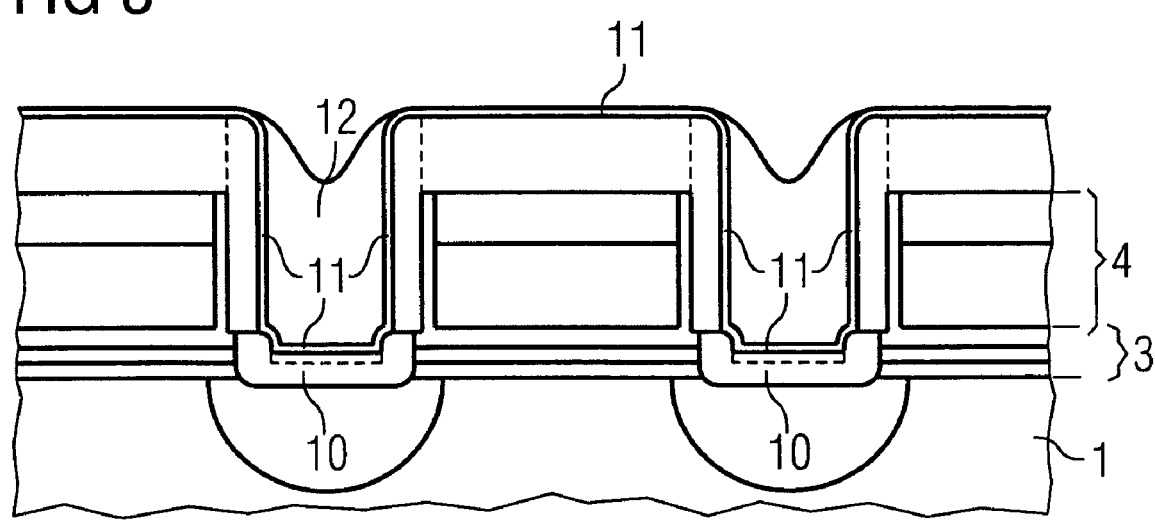
FIG. 5 shows the cross-section according to FIG. 3 after the application of the nitride liner and the spacer layer.

FIGS. 4 and 5 show cross-sections according to the cross-sections of FIGS. 2 and 3, respectively, after the application of the nitride liner 11 and the spacer layer 12. As can be seen from FIGS. 4 and 5, the nitride liner is applied all over the surface, including the wordline stacks. The spacer layer 12 is first conformally deposited and subsequently anisotropically etched back to form the sidewall spacers in the addressing periphery and the remaining parts shown in FIGS. 4 and 5 within the small spaces between neighboring wordline stacks.

FIG. 4 shows that the nitride liner 11 is spaced apart from the semiconductor material underneath by the oxidized region 10.

The alternative embodiment according to FIG. 5 also comprises lateral oxidized regions, which here separate the nitride liner 11 also from the memory layer sequence 3, especially from the memory layer itself, which may be nitride in preferred embodiments. The oxidized region 10 thus hinders or inhibits a leakage of charge carriers from the memory layer into the nitride liner 11. FIG. 5 therefore shows the preferred embodiment, although also the embodiment according to FIG. 4 provides an inventive improvement leading to better RAC values.

FIG. 6 shows a cross-section of the peripheral area of the device with the semiconductor body or substrate 1, the source/drain region 2, the gate dielectric 5, and the gate electrodes 6. The gate electrodes 6 are here represented as parts of layer stacks, with a lower layer forming the gate electrode 6, which may be doped polysilicon, and an upper layer, which can be a metal or a metal silicide. The sidewall spacers 13 are arranged above the nitride liner 11. The spacers 13 are provided for the implantation step as a mask to reduce the lateral dimension of the source/drain regions 2. FIG. 6 shows that the gate dielectric 5 comprises a partial layer that is formed of oxidized semiconductor material so that the lower boundary of the gate dielectric layer is slightly lower in the area between the gate electrode stacks than in the area beneath the stacks. The nitride liner 11 here serves as the etching stop layer when the sidewall spacers 13 are anisotropically etched, starting from a conformally deposited layer of the spacer material.

It is an advantage of the memory device according to embodiments of this invention that both the stress release and the spatial separation between the memory layer sequence and the nitride liner have a positive impact on the RAC performance of the device, while the formation of the spacers in the peripheral area is not adversely affected and can be effected in the established manner.

Although the present invention and its advantages have been described in detail, it should be understood that various changes, substitutions and alterations can be made herein without departing from the spirit and scope of the invention as defined by the appended claims.

What is claimed is:

1. A method of making a semiconductor memory device, the method comprising:
    forming a memory layer sequence over a semiconductor body, the memory layer sequence comprising a memory layer arranged between boundary layers;
    forming a gate electrode over a portion of the memory layer sequence;
    forming a sidewall insulator along a sidewall of the gate electrode;
    forming an oxide region at the surface of the semiconductor body adjacent the sidewall insulator;
    forming a nitride liner over the oxide region and the sidewall insulator; and
    forming a dielectric material over the nitride liner.

2. The method of claim 1, wherein forming a gate electrode comprises etching a gate electrode layer, the etching further comprising etching at least a portion of the memory layer sequence.

3. The method of claim 1, further comprising doping source/drain regions in said semiconductor body after forming the gate electrode.

4. The method of claim 1, wherein forming an oxide region comprises thermally oxidizing the semiconductor body.

5. The method of claim 1, wherein forming an oxide region comprises performing an annealing procedure under a nitrogen atmosphere.

6. The method of claim 1, wherein forming an oxide region comprises performing a radical-based oxidation process.

7. The method of claim 6, wherein forming an oxide region further comprises forming an oxide layer over the sidewall insulators and over an upper surface of the gate electrode.

8. The method of claim 1, further comprising forming an FET gate electrode at the same time as forming the gate electrode.

9. The method of claim 8, further comprising forming FET sidewall insulators along sidewalls of the FET gate electrode.

10. The method of claim 8, wherein the FET sidewall insulators are formed from portions of the dielectric material that was formed over the nitride layer.

* * * * *